United States Patent
Minamitani et al.

(10) Patent No.: US 7,157,905 B1
(45) Date of Patent: Jan. 2, 2007

(54) LONG MAGNETIC SENSOR

(75) Inventors: Tamotsu Minamitani, Hakusan (JP);
Koji Shinmura, Kanazawa (JP);
Masaya Ueda, Hakusan (JP);
Masanaga Nishikawa, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/466,776

(22) Filed: Aug. 24, 2006

Related U.S. Application Data (63) Continuation of application No. PCT/JP2005/002854, filed on Feb. 23, 2005.

(30) Foreign Application Priority Data

Feb. 27, 2004 (JP) ............... 2004-054767

(51) Int. Cl.
*G01B 7/00* (2006.01)
*G01R 33/09* (2006.01)
*H01L 43/08* (2006.01)
*G06K 7/08* (2006.01)

(52) U.S. Cl. ............... 324/207.21
(58) Field of Classification Search ......... 324/207.21, 324/207.24, 252, 260, 262; 338/32 R; 235/449, 235/450
See application file for complete search history.

(56) References Cited

U.S. PATENT DOCUMENTS 4,079,360 A * 3/1978 Ookubo et al. ............ 365/158
5,157,245 A * 10/1992 Shigeno et al. ............ 235/449
5,180,903 A * 1/1993 Shigeno et al. ............ 235/449
5,289,122 A * 2/1994 Shigeno .................... 324/252
5,896,030 A * 4/1999 Hasken ..................... 324/235
6,690,159 B1 * 2/2004 Burreson et al. ....... 324/207.23
6,891,367 B1 * 5/2005 Shinmura et al. .......... 324/252

FOREIGN PATENT DOCUMENTS

| JP | 58021158 | * | 2/1983 |
| JP | 61-039592 A | | 2/1986 |
| JP | 02154178 | * | 6/1990 |
| JP | 05-332703 A | | 12/1993 |
| JP | 07-297464 A | | 11/1995 |
| JP | 2921262 B2 | | 4/1999 |
| JP | 2003-107142 A | | 4/2003 |

OTHER PUBLICATIONS

International Search Report issued in corresponding International Application No. PCT/JP2005/002854, mailed on Apr. 19, 2005.

* cited by examiner

*Primary Examiner*—Edward Lefkowitz
*Assistant Examiner*—Kenneth J. Whittington
(74) *Attorney, Agent, or Firm*—Keating & Bennett, LLP (57) ABSTRACT

A plurality of magnetosensitive portions of a plurality of magnetic resistance elements and a plurality of magnets are aligned substantially linearly to be perpendicular to a moving direction of a detection object, and directions of magnetic poles of the magnets are alternately inversed, such that directions of magnetic fluxes, which are perpendicular to a surface on which the magnetosensitive portions of the magnetic resistance elements are arranged, of the continuously disposed magnets, are alternately inverse.

20 Claims, 9 Drawing Sheets

LONG MAGNETIC SENSOR

BACKGROUND OF THE INVENTION

1. Field of the Invention

The present invention relates to a long magnetic sensor for detecting a magnetic pattern which is printed on, for instance, paper money.

2. Description of the Related Art

Figure 8A:
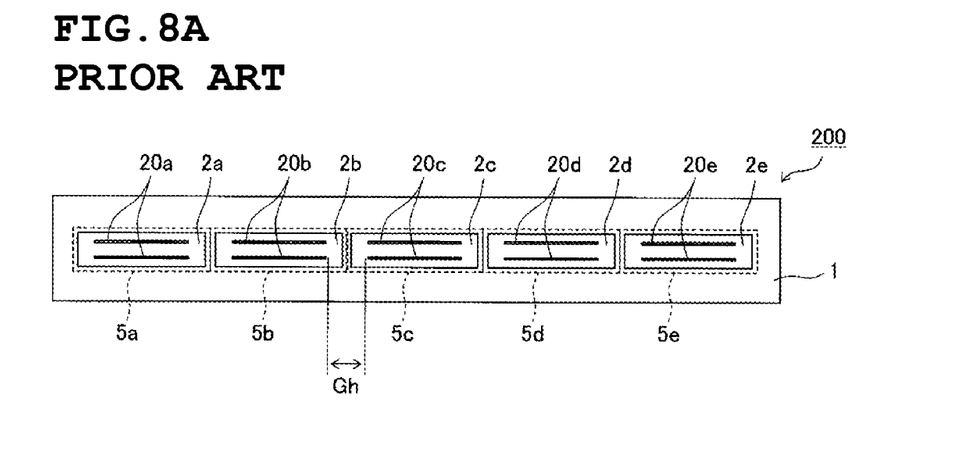
FIGS. 8A and 8B illustrates a configuration of a long magnetic sensor disclosed in Patent Document 1, and exemplary characteristics thereof.
Figure 8B:
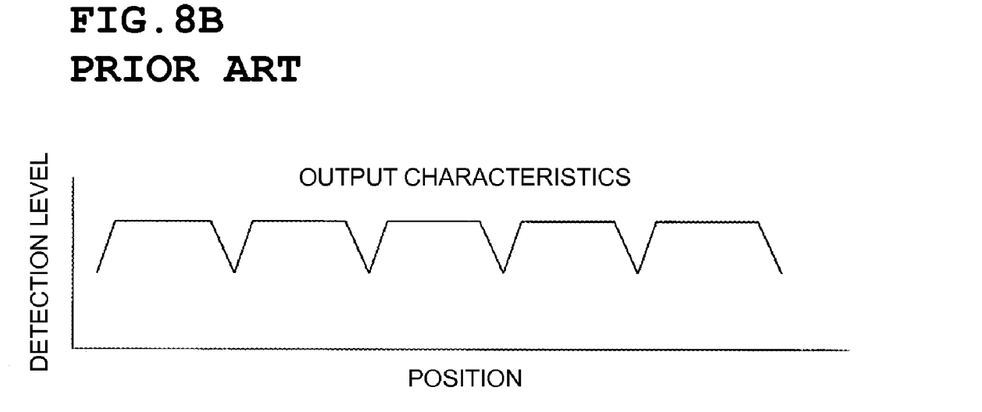

Magnetic sensors for distinguishing, for example, paper money and securities on which predetermined patterns are printed using magnetic inks are disclosed in Japanese Patent No. 2921262 (Patent Document 1) and Japanese Unexamined Patent Application Publication No. 2003-107142 (Patent Document 2). A configuration of the long magnetic sensor disclosed in Patent Document 1 is shown in FIGS. 8A and 8B. FIG. 8A is a plan view showing magnetosensitive portions with a cover being removed. In this example, magnetic resistance elements (MR elements) $2a$ to $2e$ are provided with pairs of magnetosensitive portions $20a$ to $20e$, respectively. The magnetic resistance elements $2a$ to $2e$ are aligned and fixed in a case 1. A detection object is arranged in a direction that is perpendicular to the longitudinal direction of such a long magnetic sensor 200.

Figure 9A:
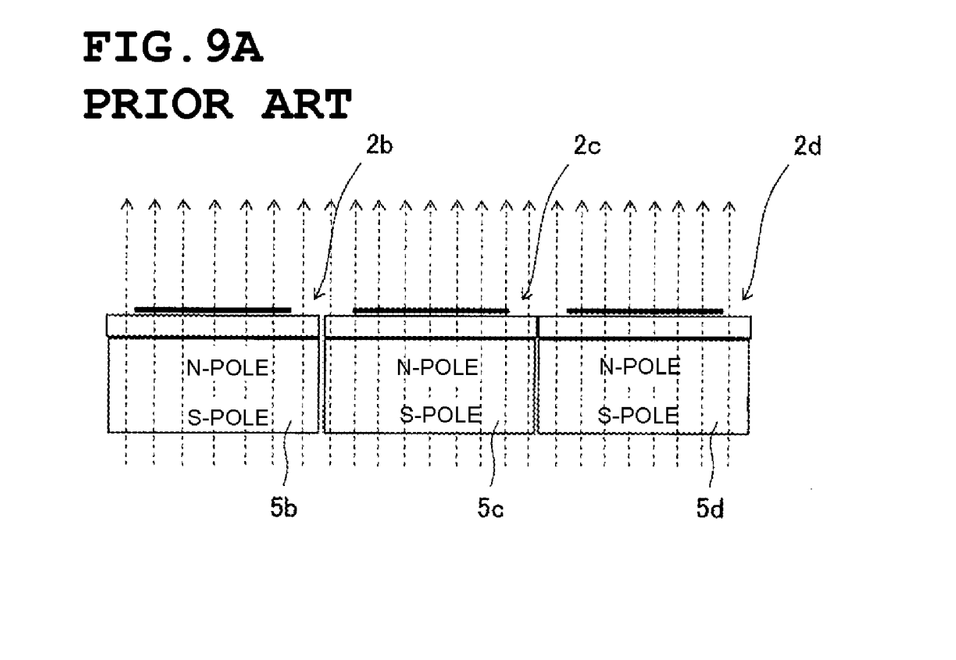
FIGS. 9A and 9B illustrate an example of a magnetic flux density distribution of the long magnetic sensor.
Figure 9B:
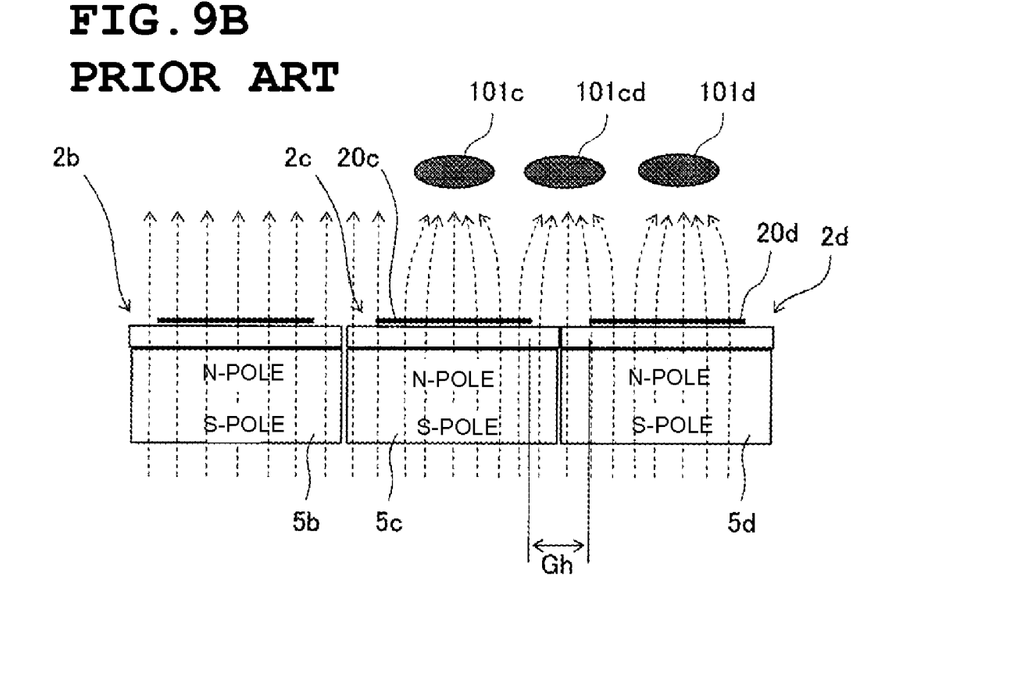

FIGS. 9A and 9B are front elevation views showing a structure of the lower portions of the magnetic resistance elements, and the state of magnetic fields which are applied to the magnetic resistance elements. Note that only three magnetic resistance elements $2b$ to $2d$ are shown here. Magnets $5b$ to $5d$ are disposed at lower portions of the magnetic resistance elements $2b$ to $2d$ so that magnetic fluxes pass through the magnetic resistance elements $2b$ to $2d$ perpendicularly.

FIG. 9B shows the state where magnetic substances (magnetic inks) $101c$, $101cd$, and $101d$ of the detection object are in the vicinity of the long magnetic sensor. The magnetic substances $101c$, $101cd$, and $101d$ reach the vicinity of the long magnetic sensor sequentially with a time-lag. When the magnetic substances $101c$, $101cd$, and $101d$ are present within the magnetic fields produced by the magnets $5c$ and $5d$, concentration of the magnetic fluxes is induced to the magnetic substances, and the magnetic flux density of the magnetic fluxes passing through the magnetosensitive portions $20c$ and $20d$ is increased. This causes an increase in the resistances of the magnetic resistance elements, and thus, the presence of the magnetic substances $101c$, $101cd$, and $101d$ is detected.

However, many of the magnetic fluxes headed toward the magnetic substance $101cd$, which are located at the central portions of the two adjacent magnetosensitive portions $20c$ and $20d$, do not pass through the magnetosensitive portions $20c$ and $20d$, but rather, pass through a gap Gh formed therebetween. Since changes in the magnetic flux density of the magnetic fluxes passing through the gap Gh do not alter a magnetic resistance effect due to the magnetosensitive portions $20c$ and $20d$, a detection level (detection capability) in the vicinity of the gap Gh is degraded. FIG. 8B shows exemplary characteristics of the detection level with respect to locations in the longitudinal direction of the long magnetic sensor.

However, the long magnetic sensor including the location where the detection level is degraded as shown in FIG. 8B is inappropriate when it is necessary to detect the magnetic substance pattern extending over the detection object. To solve this problem, as disclosed in Patent Document 2, a configuration is provided in which magnets and magnetic resistance elements are disposed in a zigzag arrangement, respectively, in a plane parallel to the magnetosensitive portions of the magnetic resistance elements.

Figure 10A:
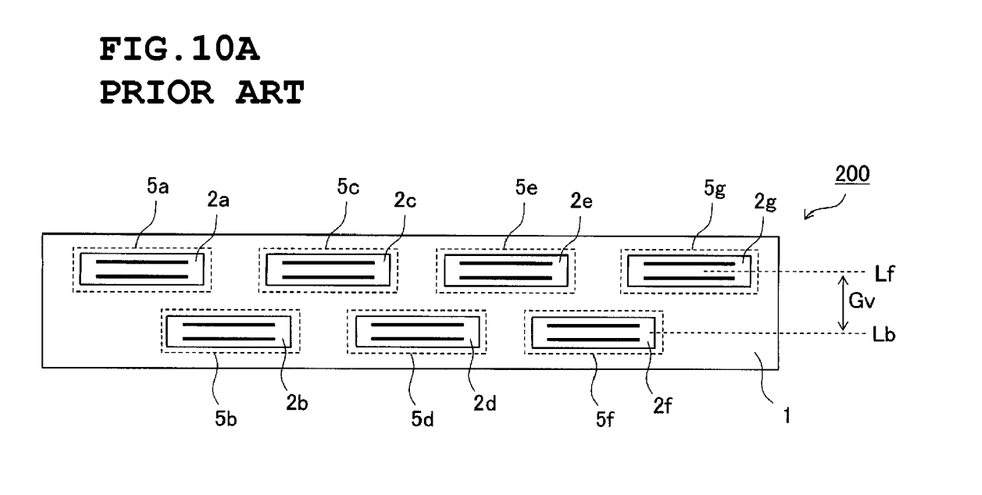
FIGS. 10A and 10B illustrate a configuration of a long magnetic sensor disclosed in Patent Document 2, and exemplary characteristics thereof.

FIG. 10A shows a configuration of such a long magnetic sensor. FIG. 10A is a plan view showing the magnetosensitive portions with the cover being removed. In this example, the magnetic resistance elements $2a$ to $2g$ are disposed in the case 1 in a staggered, zigzag manner in a plane parallel to the magnetosensitive portions. A detection object is arranged in a direction that is perpendicular to the longitudinal direction of the long magnetic sensor 200.

Figure 10B:
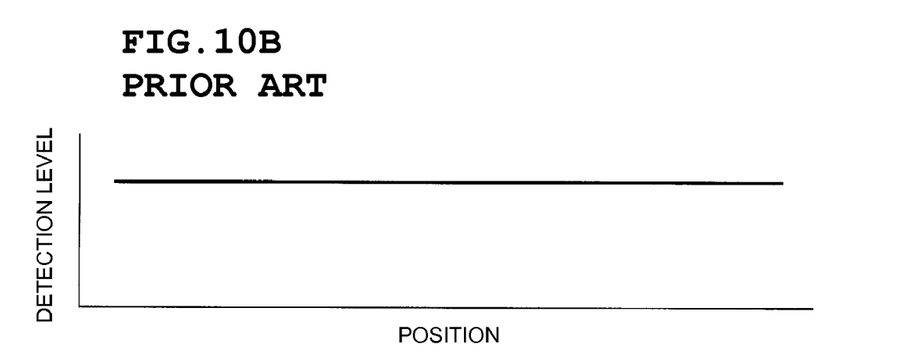

As described above, the arrangement of the plurality of magnetic resistance elements $2a$ to $2g$ in a zigzag manner ensures a substantially uniform detection level over the longitudinal direction of the long magnetic sensor as shown in the exemplary characteristics shown in FIG. 10B.

However, as shown in FIG. 10A, in the long magnetic sensor in which the magnetic resistance elements are disposed in a zigzag manner in a plane parallel to the magnetosensitive portions, the locations of the two adjacent magnetic resistance elements may be deviated from each other by a gap Gv in a moving direction of the detection object. Accordingly, additional signal processing or data processing is required for correcting a time-lag corresponding to the positional deviation of Gv. In addition, since a correction amount of the positional deviation between the adjacent magnetic resistance elements may be different from that between other adjacent magnetic resistance elements depending on the accuracy of the moving speed of the detection object, it is difficult to provide a uniform output.

Furthermore, while the detection object is moved between the case of the long magnetic sensor and a conveying roller, if a distance between the magnetosensitive portions and the detection object is varied in a path between lines Lf and Lb as shown in FIG. 10A, the detection level may also be varied. Accordingly, it is also difficult to properly adjust the distance between the conveying roller and the long magnetic sensor.

SUMMARY OF THE INVENTION

To overcome the problems described above, preferred embodiments of the present invention provide a long magnetic sensor in which no substantial gap is provided at any detection position in the longitudinal direction or in a direction that is substantially perpendicular thereto (moving direction of an detection object).

A long magnetic sensor according to a preferred embodiment of the present invention includes a plurality of magnetic resistance elements which are provided with magnetosensitive portions on surfaces or in the vicinities of the surfaces, a longitudinal direction of each of the magnetosensitive portions being substantially perpendicular to a moving direction of a detection object, and a plurality of magnets for applying magnetic fields to the magnetosensitive portions of the magnetic resistance elements, in which the magnetosensitive portions of the plurality of magnetic resistance elements and the plurality of magnets are aligned substantially linearly to be perpendicular to the moving direction of the detection object, and the magnets are disposed such that directions of magnetic fluxes, which are substantially perpendicular to the surfaces with the magnetosensitive portions of the magnetic resistance elements provided, of the adjacent magnets are inverse to each other.

The magnets are preferably disposed in one-to-one correspondence with the magnetic resistance elements.

Each of the magnetic resistance elements is preferably arranged such that at least two of the plurality of magnets define a unit in the order of arrangement of the magnets and the magnetic resistance element entirely spans the at least two magnets.

Each of the magnetic resistance elements is preferably arranged to span the adjacent magnets at each of positions where the plurality of magnets are adjacent to each other.

Frames are preferably provided in a case for housing the magnets such that the magnets are arranged along an alignment direction of the magnetic resistance elements in a zigzag manner in a plane parallel to the magnetosensitive portions of the magnetic resistance elements.

Since directions of the magnetic poles of the adjacent magnets which apply magnetic fields to the magnetic resistance elements are inverse to each other, when considering the two adjacent magnetic resistance elements, the magnetic fields are distributed such that the lines of magnetic force extend upwardly out from the lower portion of the magnetic resistance element, and downwardly into the lower portion of the magnetosensitive portion of the other magnetic resistance element adjacent to the former.

Accordingly, when the magnetic substance of the detection object reaches the position between the two adjacent magnetic resistance elements, the magnetic flux density of the magnetic fluxes passing through the magnetosensitive portions of the two magnetic resistance elements is changed, thereby enabling the detection of the magnetic substance.

In addition, since the positions of the plurality of magnetic resistance elements of the long magnetic sensor are linearly disposed, at the time of attaching the long magnetic sensor to a device, a diameter of a roller for moving the detection object, and a distance therebetween is easily adjusted. Further, since the magnetic poles of the adjacent magnets are heteropolar, the magnets are attracted to each other and do not repel each other. Accordingly, the magnets are easily housed in magnet housings of the case.

Since the magnets are disposed in one-to-one correspondence with the magnetic resistance elements, the magnetic flux passes perpendicularly through each magnetosensitive portion at the central portion of the magnetosensitive portion of the magnetic resistance element, similarly to the conventional art. Accordingly, the detection characteristics similar to that of the conventional art are obtained at the central portion of the magnetosensitive portion.

Since each of the magnetic resistance elements is disposed such that at least two of the plurality of magnets define a unit in the order of arrangement of the magnets, and the magnetic resistance element entirely spans the at least two magnets, the number of the magnets is increased (at least twice) with respect to that of the magnetic resistance elements, and positions of the lines of magnetic force are arranged at a narrow pitch in a direction toward the detection object.

Accordingly, an ability to compensate the degradation of the output is enhanced at the end portions of the magnetosensitive portion of the magnetic resistance element, and the output characteristics similar to that of the conventional art are provided at the central portion of the magnetosensitive portion.

Since each of the magnetic resistance elements is arranged to span the adjacent magnets at each of positions where the plurality of magnets are adjacent to each other, the central portion of the magnet is located between the two magnetic resistance elements adjacent to each other. Generally, the magnetic flux density of the central portion of the magnet is high and stable as compared to the end portions thereof, the degradation of the detection level between the magnetic resistance elements is compensated for, thereby providing the detection level characteristics having a flat line over the longitudinal direction. In addition, even when the positions of the borders of the adjacent magnets are unevenly disposed, the variation in the detection level due to the unevenness is reduced.

Since the frames are arranged in the case such that the magnets are disposed along the alignment direction of the magnetic resistance elements in a zigzag manner in a plane parallel to the magnetosensitive portions of the magnetic resistance elements, in view of the design of the case structure for housing the magnetic resistance elements and the magnets, the positions of the magnets relative to the case are accurately determined, and consequently, the long magnetic sensor with the attachment accuracy being improved and the characteristics thereof being uniform is stably produced.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

A configuration of a long magnetic sensor according to a first preferred embodiment of the present invention will be described below with reference to FIGS. 1A to 4B.

Figure 1A:
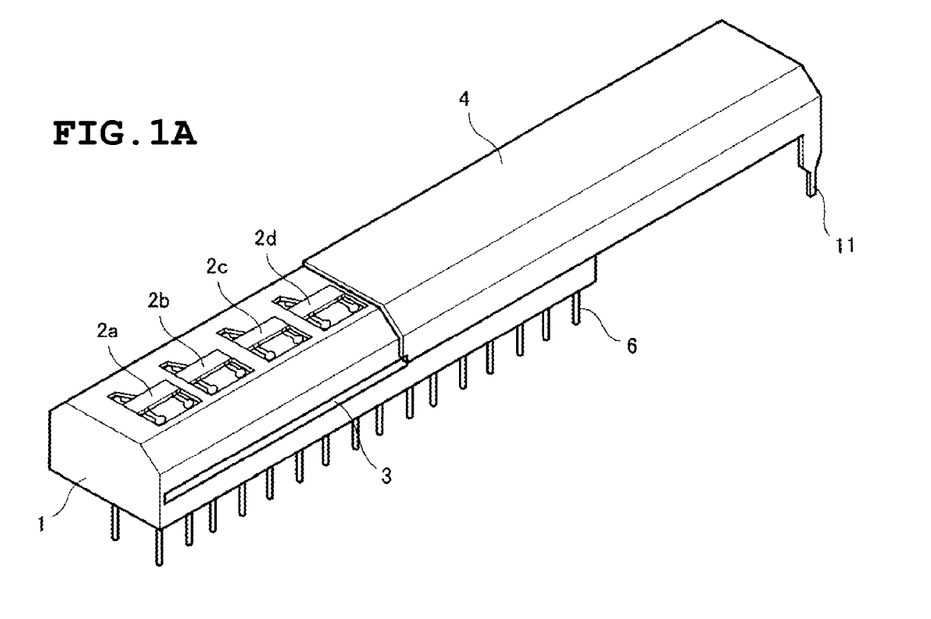
FIGS. 1A and 1B are external perspective views showing a long magnetic sensor according to a first preferred embodiment of the present invention.
Figure 1B:
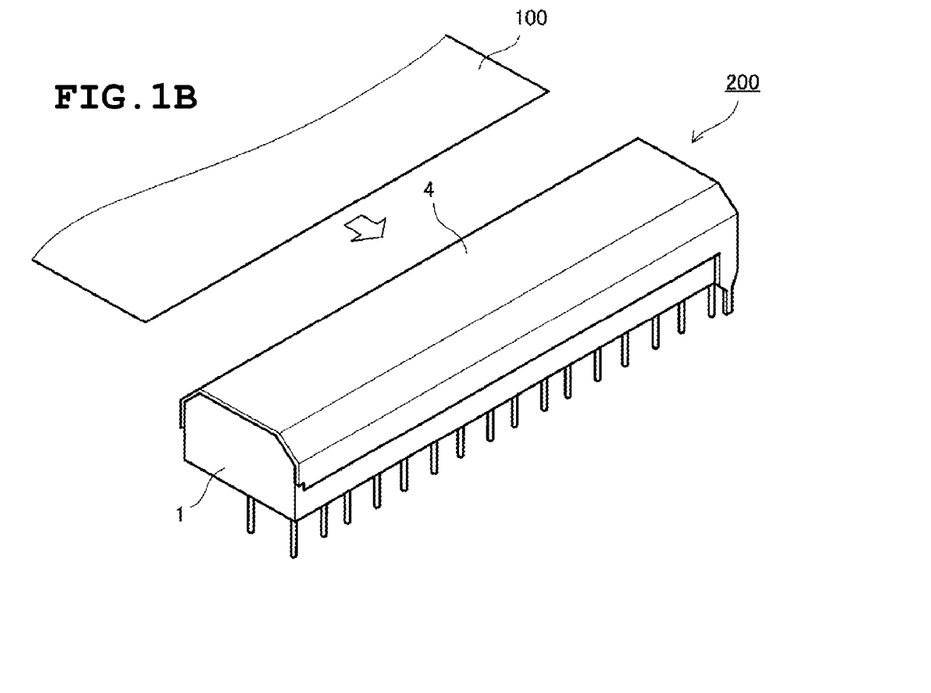

FIGS. 1A and 1B are external perspective views showing a long magnetic sensor, in which FIG. 1A shows the state in the middle of attaching a cover, and FIG. 1B shows the state with the cover attached. Magnetic resistance elements 2a, 2b, 2c, 2d . . . are mounted on the upper portion of a case 1 made of synthetic resin. Terminal pins 6 which are connected to the plurality of magnetic resistance elements 2a, 2b, 2c, 2d . . . project at the lower portion of the case 1. Claw-engaging grooves 3 are provided on both lateral sides of the case 1 along the longitudinal direction.

A metal cover 4 is provided with cover-fixing claws which are engaged with the claw-engaging grooves 3 of the case. When the cover 4 slides in the longitudinal direction while both the claw-engaging grooves 3 and the cover-fixing claws are engaged with each other, the cover 4 covers the upper portion of the case 1 as shown in FIG. 1B. A detection object 100 is moved in a direction substantially perpendicular to the longitudinal direction of the long magnetic sensor 200 as shown by an arrow in the drawing.

The cover 4 is provided with a cover terminal 11 to be electrically ground connected to a circuit board.

Figure 2A:
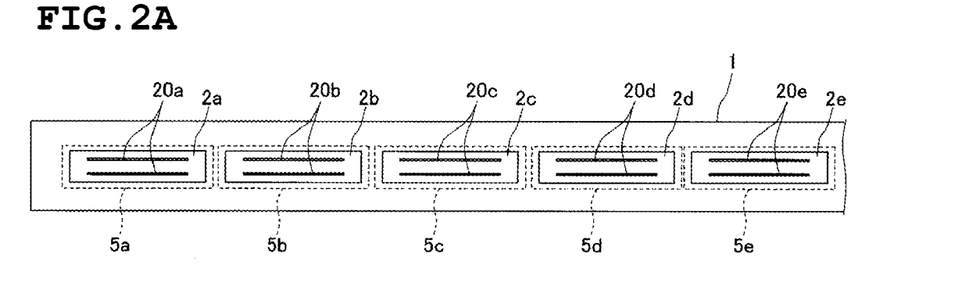
FIGS. 2A–2C illustrate a positional relationship between magnetic resistance elements and magnets of the long magnetic sensor, and detection level characteristics with respect to positions in the longitudinal direction.
Figure 2B:
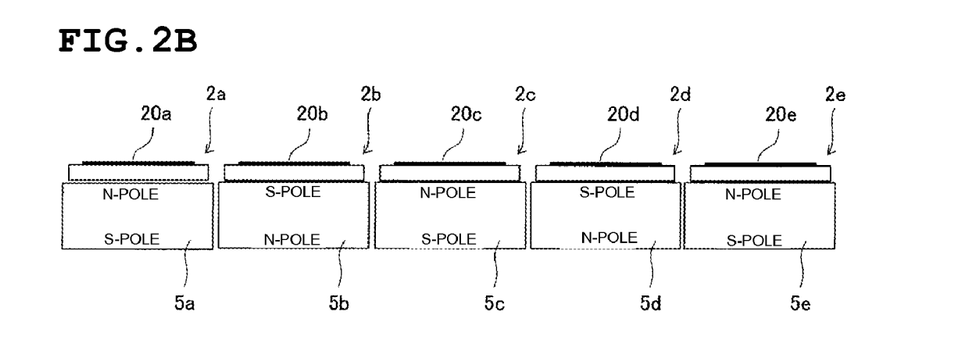

FIG. 2A is a plan view showing a state with the cover removed from the long magnetic sensor shown in FIGS. 1A and 1B. FIG. 2B is a cross-sectional view taken along a plane perpendicular to the surface with magnetosensitive portions provided thereon, and passing through the plurality of magnetic resistance elements and the plurality of magnets. Note that FIGS. 2A and 2B only show the magnetic resistance elements 2a to 2e. In addition, FIG. 2B, the illustration of the case 1 is omitted.

Magnets 5a to 5e are provided at the lower portions of the magnetic resistance elements 2a to 2e, respectively. Magnetosensitive portions 20a to 20e are provided at the magnetic resistance elements 2a to 2e, respectively. When the detection object 100 shown in FIG. 1B is a sheet of paper, such as paper money, while the object may not always be moved in a direction exactly perpendicular to the longitudinal direction of the long magnetic sensor 200, the magnetosensitive portions 20a to 20e are provided on the surfaces or in the vicinities of the surfaces of the magnetic resistance elements 2a to 2e such that the longitudinal direction of the magnetosensitive portions 20a to 20e are substantially perpendicular to the moving direction of the detection object.

Directions of magnetic poles (N-pole and S-pole) of the magnets 5a to 5e are arranged such that the magnetic fluxes pass substantially perpendicularly through the magnetic resistance elements 2a to 2e, and the directions of the magnetic poles of the adjacent magnet are inverse to each other. That is, the N-pole of the magnet 5a faces the magnetic resistance element 2a, while the S-pole of the magnet 5b which is adjacent to the magnet 5a faces the magnetic resistance element 2b. Then the N-pole of the magnet 5c which is adjacent to the magnet 5b faces the magnetic resistance element 2c. Similarly to the above-described arrangement, the direction of the magnetic poles of the adjacent magnets is inverse to each other.

Figure 3A:
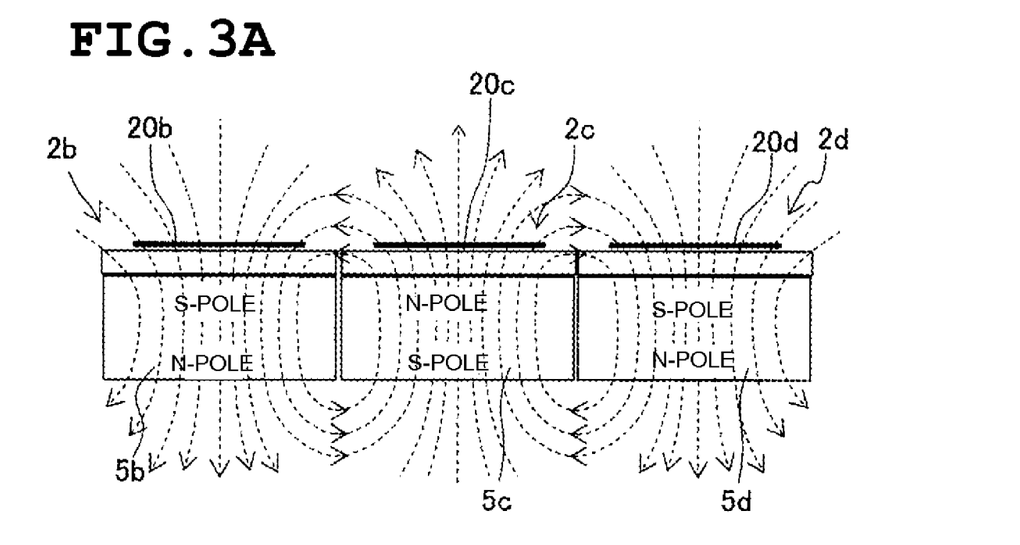
FIGS. 3A and 3B illustrate a magnetic flux density distribution due to the magnet of the long magnetic sensor, and a change in magnetic flux density due to the presence of a magnetic substance.

FIGS. 3A and 3B are examples of a magnetic field distribution when the directions of the magnetic poles of the magnets are disposed as shown in FIG. 2A. As shown in FIG. 3A, lines of magnetic force from the N-pole of the magnet 5c extend upwardly and pass through the magnetosensitive portion 20c of the magnetic resistance element 2c. Then the lines of magnetic force extend downwardly through the magnetosensitive portions 20b and 20d of the magnetic resistance elements 2b and 2d, and then to the S-poles of the magnets 5b and 5d. At this time, the lines of magnetic force of the magnetic flux from the N-pole of the magnet 5c are curved in a loop form and then extend to the S-poles of the adjacent magnets 5b and 5d.

Figure 3B:
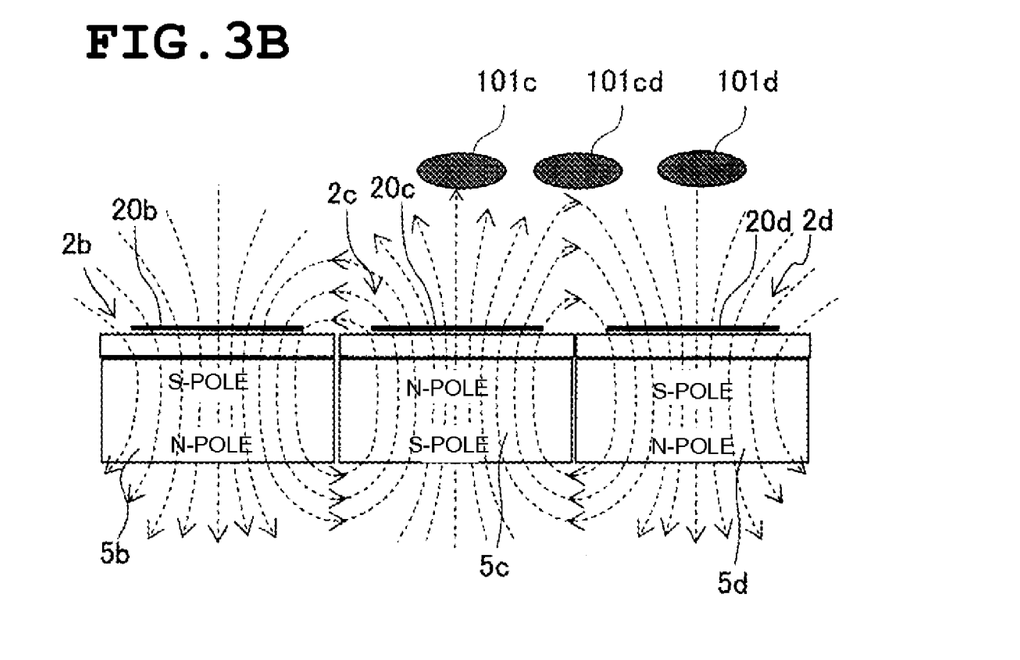

As shown in FIG. 3B, when the magnetic substances 101c, 101cd and 101d of the detection object are in the vicinities of the magnetic resistance elements 2c and 2d, and the magnetosensitive portions 20c and 20d, sequentially with a time-lag, the magnetic flux heading toward the magnet 5d from the magnet 5c is attracted by the magnetic substance 101cd, passes through the magnetosensitive portions 20c and 20d of the magnetic resistance elements 2c and 2d nearly perpendicularly, and the magnetic flux density thereof is increased. Consequently, the presence of the magnetic substance 101cd is detected due to the change in resistances of the magnetic resistance elements 2c and 2d. In addition, since the magnetic flux density of the magnetic flux passing through the magnetosensitive portion 20c of the magnetic resistance element 2c is increased because of the presence of the magnetic substance 101c, it is detected that the magnetic substance 101c has reached this location due to the change in the resistance of the magnetic resistance element 2c. Similarly, since the magnetic flux density of the magnetic flux passing through the magnetosensitive portion 20d of the magnetic resistance element 2d is increased because of the presence of the magnetic substance 101d, it is detected that the magnetic substance 101d has reached this position due to the change in the resistance of the magnetic resistance element 2d.

Figure 2C:
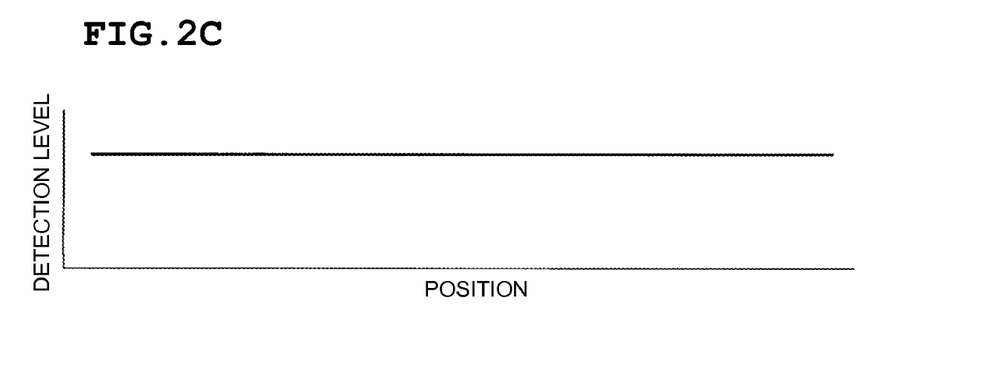

FIG. 2C shows exemplary characteristics of the detection level with respect to positions of the long magnetic sensors in the longitudinal direction. When the magnetic resistance element is viewed in a plane parallel to the magnetosensitive portion, since the magnetic substance is detected even at a position where the magnetosensitive portion is not provided, as shown in the drawing, the detection level is not degraded at any position in the longitudinal direction of the long magnetic sensor and provides a substantially uniform detection level.

Figure 4A:
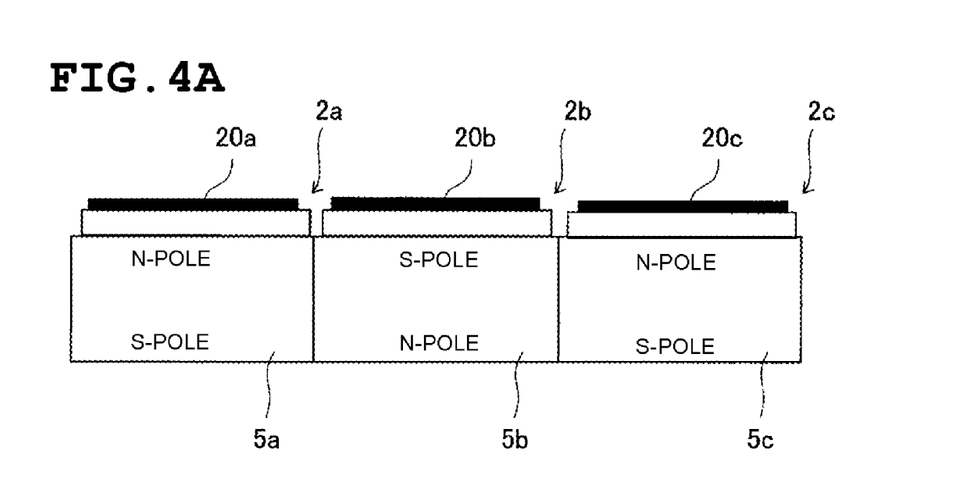
FIGS. 4A and 4B illustrate an example of a positional relationship between the adjacent magnetic resistance elements, and another example of a positional relationship between the adjacent magnets.
Figure 4B:
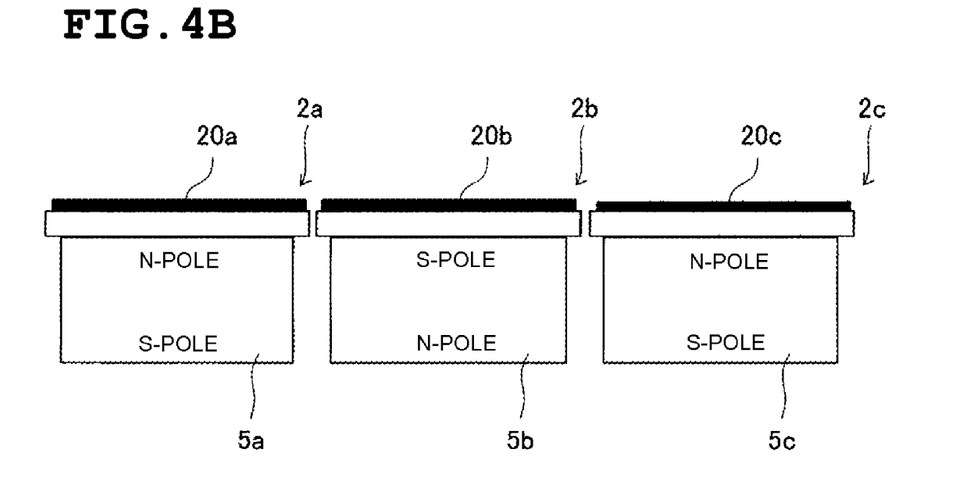

In the examples as shown in FIGS. 2A through 3B, while small gaps are provided between the adjacent magnets and between the adjacent magnetic resistance elements, the continuously disposed magnets 5a, 5b and 5c are closely attached as shown in FIG. 4A. Alternatively, as shown in FIG. 4B, the gap between the continuously disposed magnets 5a, 5b and 5c may be different from that of the continuously disposed magnetic resistance elements 2a, 2b and 2c, namely, the gap between the magnets 5a, 5b and 5c may be larger than that among the magnetosensitive portions 20a, 20b and 20c of the magnetic resistance elements 2a, 2b and 2c.

Next, a long magnetic sensor according to a second preferred embodiment will be described below with reference to FIGS. 5A and 5B.

Figure 5A:
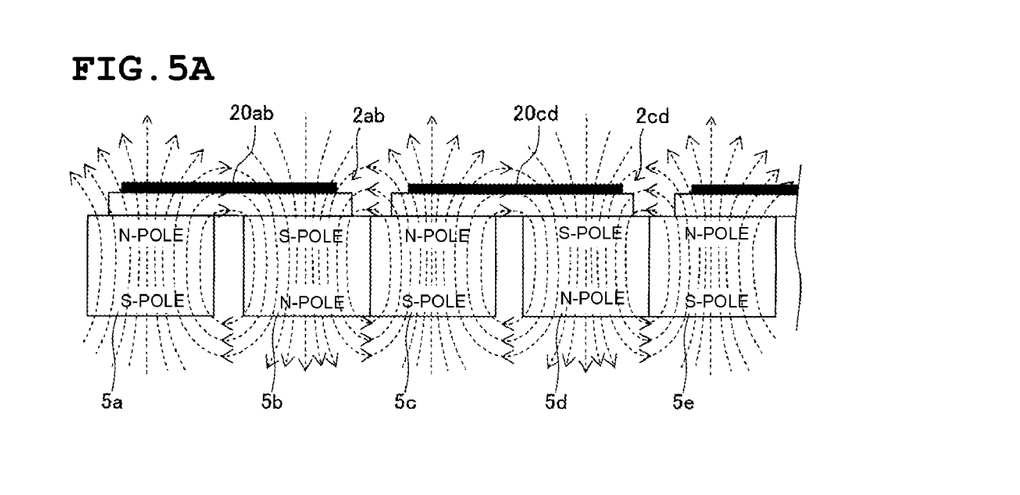
FIGS. 5A and 5B illustrate positional relationships between magnetic resistance elements and magnets of a long magnetic sensor according to a second preferred embodiment of the present invention.

As shown in an example in FIG. 5A, the magnetic resistance element is disposed such that two of the plurality of magnets define a unit in the order of arrangement, and the magnetic resistance element spans the two magnets. Particularly, a magnetic resistance element 2ab is arranged to span the magnets 5a and 5b. In addition, a magnetic resistance element 2cd is arranged to span the magnets 5c and 5d.

With this structure, the magnetic flux from the magnet 5a comes into the adjacent magnet 5b. The magnetic flux from the magnet 5a passes through the left portion of the magnetosensitive portion 20ab, then passes through the right portion thereof, and then extends into the magnet 5b. Similarly, the magnetic flux from the magnet 5c passes through the left portion of a magnetosensitive portion 20cd, then passes through the right portion thereof, and then extends into the magnet 5d. Further, the magnetic flux from the magnet 5c passes through the left portion of the magnetosensitive portion 20cd, then passes through the right portion of the magnetosensitive portion 20ab, and then extends into the magnet 5b.

Accordingly, when viewed in a plane parallel to the magnetosensitive portion, if the magnetic substance of the detection object is present at the central portion of the magnetosensitive portion 20ab, 20cd, the presence of the magnetic substance is detected due to the change in the resistance of the magnetic resistance element provided with the magnetosensitive portion. In addition, if the magnetic substances is present at a position where the magnetosensitive portion is not provided, such as a position between the magnetosensitive portions 20ab and 20cd, similarly to the first preferred embodiment, the presence of the magnetic substance is detected due to the change in the resistances of both the magnetic resistance elements 2ab and 2cd provided with the magnetosensitive portions 20ab and 20cd.

Figure 5B:
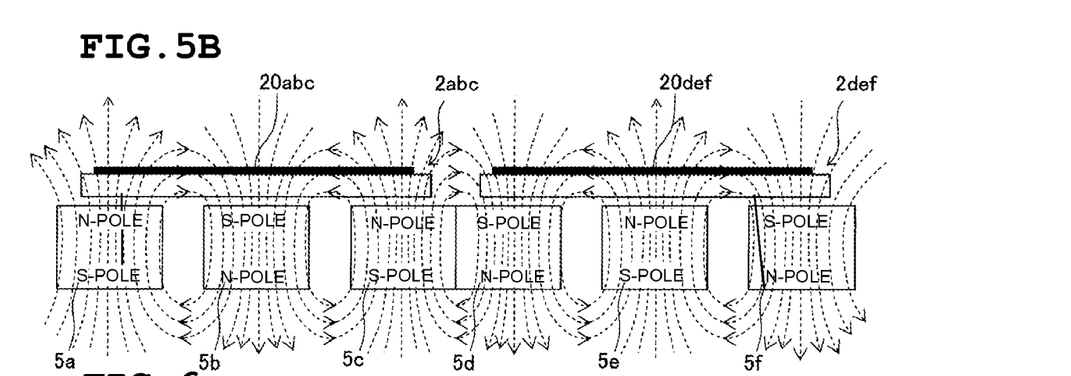

In addition to the example shown FIG. 5A, the magnetic resistance elements may be disposed such that, for instance as shown in FIG. 5B, three magnets (5a, 5b and 5c) and (5d, 5e and 5f) define units, respectively, in the order of arrangement, and magnetic resistance elements 20abc and 20def entirely span the units of the magnets, respectively. Alternatively, four or more magnets may define a unit. That is, a magnetic resistance element may be disposed such that at least two of the magnets define a unit, and the magnetic resistance element entirely spans the at least two magnets.

Figure 6:
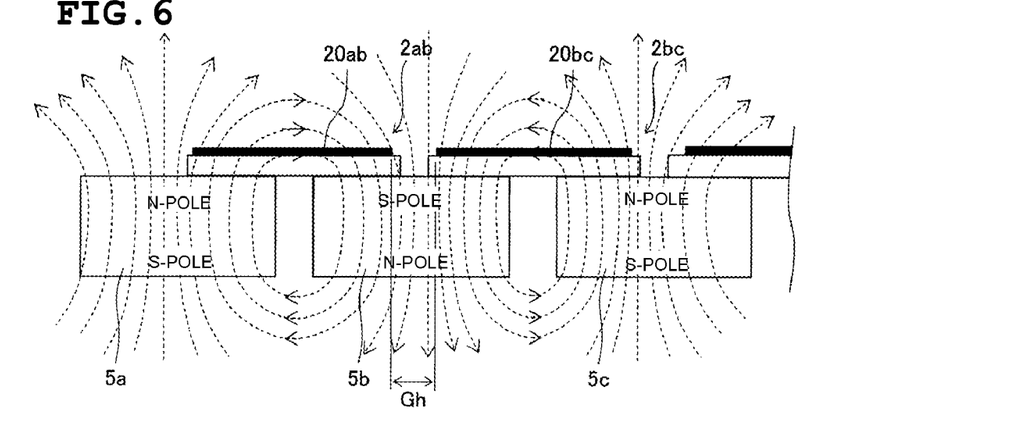
FIG. 6 illustrates a positional relationship between magnetic resistance elements and magnets of a long magnetic sensor according to a third preferred embodiment of the present invention.

Next, a long magnetic sensor according to a third preferred embodiment will be described below with reference to FIG. 6.

In this example, a magnetic resistance element is disposed to span the adjacent magnets, at each of positions where the magnets are adjacent to each other. In this example, the magnetic resistance element 2ab is disposed to span the magnets 5a and 5b. Then, a magnetic resistance element 2bc is disposed to span the magnets 5b and 5c. In addition, the magnets 5a, 5b and 5c are disposed such that the magnetic poles of the continuously disposed magnets are alternately inverse to one another.

With this configuration, the central portion of the magnet is located at a position corresponding to a gap provided between the magnetosensitive portions of the two adjacent magnetic resistance elements. In the example shown in FIG. 6, the central portion of the magnet 5b is located at a position corresponding to a gap Gh provided between the magnetosensitive portions 20ab and 20bc of the magnetic resistance elements 2ab and 2cd. Since the magnetic flux density of the central portion of the magnet is high and stable as compared with that of the end portions, the magnetic flux density between the adjacent magnetosensitive portions is greater than other region. Consequently, the degradation of the detection level at the position corresponding to the gap Gh is compensated for, and detection level characteristics having a flat line over the longitudinal direction is obtained.

In addition, even when the borders of the adjacent magnets are unevenly disposed, since the magnetic flux density at the position corresponding to the gap Gh is maintained high, the variation in the detection level due to the unevenness is reduced. Note that the characteristics shown between the magnets are similar to that of the second preferred embodiment.

Next, a long magnetic sensor according to a fourth preferred embodiment will be described below with reference to FIG. 7.

Figure 7:
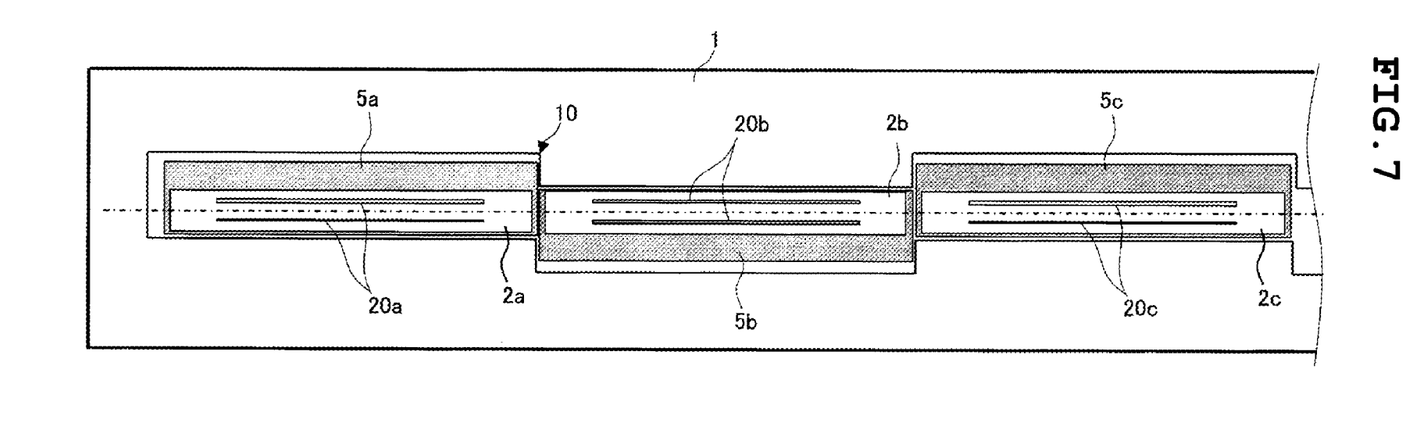
FIG. 7 illustrates a positional relationship between magnetic resistance elements with respect to a case, of a long magnetic sensor according to a fourth preferred embodiment.

FIG. 7 is a plan view partially showing a plane parallel to the magnetosensitive portions of the magnetic resistance elements of the long magnetic sensor. The magnetic resistance elements 2a to 2c are linearly disposed as shown by a chain line in FIG. 7. The magnets 5a, 5b and 5c are disposed at the magnetic resistance elements 2a, 2b and 2c, respectively. Unlike the first preferred embodiment, frames 10 are provided at the bottom surface of the case 1 such that the magnets are disposed along the arrangement of the magnetic resistance elements 2a to 2c in a staggered manner in a plane parallel to the magnetosensitive portions 20a, 20b and 20c of the magnetic resistance elements. Accordingly, the frames 10 define magnet housings disposed in a zigzag manner, so that the positions of the magnets can be easily determined relative to the case by sequentially attaching the magnets to the frames 10. In addition, since the directions of the magnetic poles of the adjacent magnets are inverse to each other, and therefore the magnets are attracted to each other to be linearly disposed as shown by a chain line in the drawing, the positions of the magnets can be automatically set in a direction that is substantially perpendicular to the chain line in the drawing.

Note that FIG. 7 shows an example in which the arrangement of the magnets relative to the case is applied to the first preferred embodiment. However, this arrangement may be alternatively applied to the second and third preferred embodiments in a similar manner.

The present invention can be used for absorbing vibration due to friction between moving plates.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A long magnetic sensor comprising:
  a plurality of magnetic resistance elements which are provided with magnetosensitive portions on surfaces thereof or in the vicinities of the surfaces, a longitudinal direction of each of the magnetosensitive portions being substantially perpendicular to a moving direction of a detection object; and
  a plurality of magnets arranged to apply magnetic fields to the magnetosensitive portions of the plurality of magnetic resistance elements; wherein
  the magnetosensitive portions of the plurality of magnetic resistance elements and the plurality of magnets are aligned substantially linearly to be substantially perpendicular to the moving direction of the detection object; and
  the plurality of magnets are disposed such that directions of magnetic fluxes, which are substantially perpendicular to the surfaces with the magnetosensitive portions of the plurality of magnetic resistance elements, of adjacent pairs of the plurality of magnets are inverse to each other.

2. The long magnetic sensor according to claim 1, wherein the plurality of magnets are disposed in one-to-one correspondence with the plurality of magnetic resistance elements.

3. The long magnetic sensor according to claim 1, wherein each of the plurality of magnetic resistance elements is disposed such that at least two of the plurality of magnets define a unit in the order of arrangement of the plurality of magnets, and each of the plurality of magnetic resistance elements entirely spans the at least two magnets.

4. The long magnetic sensor according to claim 3, wherein the at least two of the plurality of magnets includes two magnets.

5. The long magnetic sensor according to claim 3, wherein the at least two of the plurality of magnets includes three magnets.

6. The long magnetic sensor according to claim 1, wherein each of the plurality of magnetic resistance elements is disposed to span the adjacent magnets at each of positions at which the plurality of magnets are adjacent to each other.

7. The long magnetic sensor according to claim 1, further comprising:
a case arranged to house the plurality of magnetic resistance elements and the plurality of magnets; wherein
frames are provided in the case such that the plurality of magnets are disposed along an alignment direction of the plurality of magnetic resistance elements in a zigzag manner in a plane parallel to the magnetosensitive portions of the plurality of magnetic resistance elements.

8. The long magnetic sensor according to claim 1, further comprising:
a case arranged to house the plurality of magnetic resistance elements and the plurality of magnets; and
a cover arranged to cover the plurality of magnetic resistance elements and the plurality of magnets.

9. The long magnetic sensor according to claim 8, wherein the case is made of a synthetic resin.

10. The long magnetic sensor according to claim 8, wherein the case includes claw-engaging grooves, and the cover includes cover-fixing claws which are engaged with the claw-engaging grooves.

11. The long magnetic sensor according to claim 1, wherein each of the plurality of magnetic resistance elements is disposed to span the adjacent magnets at each of positions at which the plurality of magnets are adjacent to each other.

12. A long magnetic sensor comprising:
a case;
a plurality of magnets disposed on the case;
a plurality of magnetic resistance elements disposed on the plurality of magnets, and which are provided with magnetosensitive portions on surfaces or in the vicinities of the surfaces, a longitudinal direction of each of the magnetosensitive portions being substantially perpendicular to a moving direction of a detection object; wherein
the plurality of magnets applies magnetic fields to the magnetosensitive portions of the plurality of magnetic resistance elements;
the magnetosensitive portions of the plurality of magnetic resistance elements and the plurality of magnets are aligned substantially linearly to be substantially perpendicular to the moving direction of the detection object; and
the plurality of magnets are disposed such that directions of magnetic fluxes, which are substantially perpendicular to the surfaces with the magnetosensitive portions of the magnetic resistance elements, of the adjacent ones of the magnets are inverse to each other.

13. The long magnetic sensor according to claim 12, wherein each of the plurality of magnetic resistance elements is disposed such that at least two of the plurality of magnets define a unit in the order of arrangement of the plurality of magnets, and each of the plurality of magnetic resistance elements entirely spans the at least two magnets.

14. The long magnetic sensor according to claim 13, wherein the at least two of the plurality of magnets includes two magnets.

15. The long magnetic sensor according to claim 13, wherein the at least two of the plurality of magnets includes three magnets.

16. The long magnetic sensor according to claim 12, wherein the plurality of magnets are disposed in one-to-one correspondence with the plurality of magnetic resistance elements.

17. The long magnetic sensor according to claim 12, wherein frames are provided in the case such that the plurality of magnets are disposed along an alignment direction of the plurality of magnetic resistance elements in a zigzag manner in a plane parallel to the magnetosensitive portions of the plurality of magnetic resistance elements.

18. The long magnetic sensor according to claim 12, further comprising a cover arranged to cover the magnetic resistance elements and the magnets.

19. The long magnetic sensor according to claim 12, wherein the case is made of a synthetic resin.

20. The long magnetic sensor according to claim 18, wherein the case includes claw-engaging grooves, and the cover includes cover-fixing claws which are engaged with the claw-engaging grooves.

* * * * *